(12) United States Patent
Takekida

(10) Patent No.: US 9,048,328 B2
(45) Date of Patent: Jun. 2, 2015

(54) SEMICONDUCTOR DEVICE HAVING PLURAL MEMORY CELLS WITH CAVITIES FORMED THEREIN, AND METHOD OF MANUFACTURING THE SAME

(71) Applicant: KABUSHIKI KAISHA TOSHIBA, Minato-ku, Tokyo (JP)

(72) Inventor: Hideto Takekida, Aichi-ken (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 90 days.

(21) Appl. No.: 13/736,273

(22) Filed: Jan. 8, 2013

(65) Prior Publication Data

US 2013/0175592 A1    Jul. 11, 2013

(30) Foreign Application Priority Data

Jan. 11, 2012  (JP) ................. 2012-003013

(51) Int. Cl.
| | |
|---|---|
| *H01L 29/788* | (2006.01) |
| *H01L 27/06* | (2006.01) |
| *H01L 29/66* | (2006.01) |
| *H01L 27/115* | (2006.01) |
| *H01L 21/28* | (2006.01) |
| *H01L 49/02* | (2006.01) |
| *H01L 29/51* | (2006.01) |
| *H01L 29/423* | (2006.01) |

(52) U.S. Cl.
CPC .............. *H01L 29/788* (2013.01); *H01L 27/06* (2013.01); *H01L 29/66007* (2013.01); *H01L 27/11517* (2013.01); *H01L 21/28273* (2013.01); *H01L 29/66825* (2013.01); *H01L 29/7881* (2013.01); *H01L 27/11521* (2013.01); *H01L 27/11526* (2013.01); *H01L 27/11529* (2013.01); *H01L 27/11543* (2013.01); *H01L 28/60* (2013.01); *H01L 29/42372* (2013.01); *H01L 29/42376* (2013.01); *H01L 29/515* (2013.01)

(58) Field of Classification Search
CPC ................... H01L 27/11524; H01L 27/11526; H01L 27/11529
USPC .......... 257/204, 314, 315, 321, 324, E29.242, 257/E29.3, E29.309; 365/185.01
See application file for complete search history.

(56) References Cited

U.S. PATENT DOCUMENTS

| | | | |
|---|---|---|---|
| 7,391,076 B2 | 6/2008 | Ozawa | |
| 2002/0070402 A1* | 6/2002 | Ichige et al. | .................. 257/296 |
| 2004/0238881 A1 | 12/2004 | Ozawa | |
| 2007/0127320 A1 | 6/2007 | Caffrey et al. | |
| 2007/0145470 A1 | 6/2007 | Ozawa | |

(Continued)

FOREIGN PATENT DOCUMENTS

| | | |
|---|---|---|
| JP | 2008-177327 A | 7/2008 |
| JP | 2010-123890 A | 6/2010 |
| JP | 2011-014838 A | 1/2011 |

*Primary Examiner* — Tucker Wright
(74) *Attorney, Agent, or Firm* — Holtz, Holtz, Goodman & Chick PC

(57) ABSTRACT

A semiconductor device includes, a semiconductor substrate, a plurality of memory cells being provided on the semiconductor substrate in a memory cell region. Each of the plurality of memory cells having a first gate electrode disposed on the semiconductor substrate with a first gate insulating film, and the first gate electrode having a first charge storage layer, a first inter-electrode insulating film and a first control gate electrode film, and a cavity is interposed between an upper surface of the charge storage layer and the inter-electrode insulating film.

10 Claims, 23 Drawing Sheets

(56) References Cited

U.S. PATENT DOCUMENTS

| | | | |
|---|---|---|---|
| 2007/0164343 A1* | 7/2007 | Matsui et al. | 257/314 |
| 2008/0197403 A1* | 8/2008 | Ozawa et al. | 257/321 |
| 2010/0127320 A1 | 5/2010 | Nishihara et al. | |
| 2011/0001180 A1 | 1/2011 | Masuda et al. | |

* cited by examiner

SEMICONDUCTOR DEVICE HAVING PLURAL MEMORY CELLS WITH CAVITIES FORMED THEREIN, AND METHOD OF MANUFACTURING THE SAME

CROSS-REFERENCE TO RELATED APPLICATIONS

This application is based upon and claims the benefit of priority from the prior Japanese Patent Application No. 2012-003013, filed Jan. 11, 2012, the entire contents of which are incorporated herein by reference.

FIELD

Embodiments of the present invention relate to a semiconductor device and a method of manufacturing a semiconductor device.

BACKGROUND

A flash memory device, for example, has a configuration in which: a large number of memory cells are arrayed in the word line direction and in the bit line direction; and each memory cell is formed with an inter-electrode insulating film provided between a floating gate electrode film as a charge storage layer and a control gate electrode film. In this configuration, the flash memory device uses a structure in which the control gate electrode films CG extend downwards at element isolation regions. Thereby, the coupling between the control gate electrode films CG and the floating gate electrode films FG is enhanced. In order to further enhance the coupling, the control gate electrode films CG may extend further downwards at the element isolation regions. However, if the amount of downward extension, namely the amount of etching back, is too large, the upper portion of each of the floating gate electrode films, namely extremity, will have a more tapered and rounded shape as a result of etching. In recent years, the width of the floating gate electrode films and the width of element isolation trenches are becoming narrower along with higher integration of flash memory devices. This makes it more likely that: the extremity of each of the floating gate electrode films have a pointed shape; the electric field concentrates on the pointed portion; the leakage current increases between the floating gate electrode films and the control gate electrode films; and therefore, the write characteristics deteriorate.

DETAILED DESCRIPTION

Figure 1:
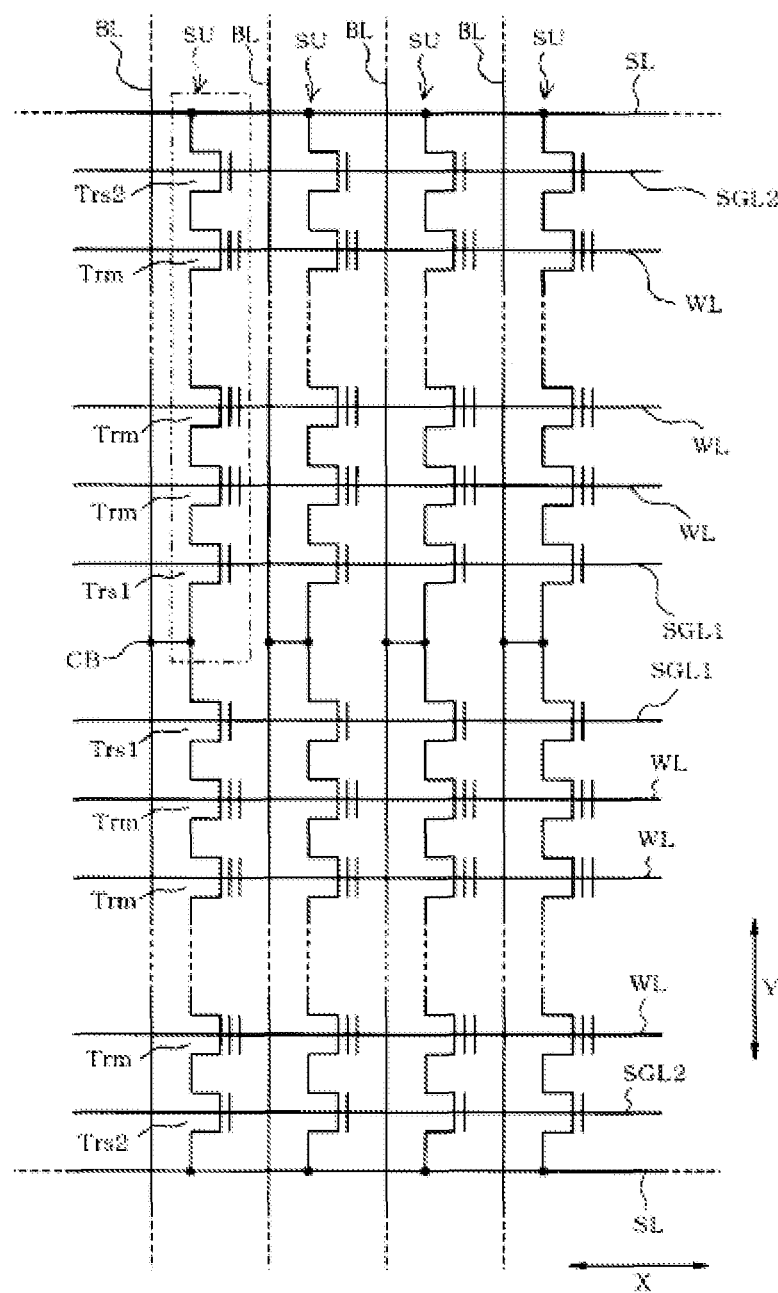
FIG. 1 is a representative circuit schematic showing an example of a part of a memory cell array of a NAND flash memory device of a first embodiment.

A non-volatile semiconductor memory device of an embodiment includes: a semiconductor substrate; a memory cell region provided on the semiconductor substrate and including multiple memory cells being formed in the memory cell region; and a gate electrode formed above the memory cell region with a gate insulating film interposed in between and formed by stacking a charge storage layer, an inter-electrode insulating film and a control gate electrode film. In addition, the gate electrode of the memory cell region is provided with a cavity between an upper surface of the charge storage layer and the inter-electrode insulating film.

A method of manufacturing a semiconductor device of the embodiment includes the steps of: forming a gate insulating film on a semiconductor substrate; forming a charge storage layer on the gate insulating film; forming a sacrificial film on the charge storage layer; and forming an element isolation trench in the semiconductor substrate, the gate insulating film, the charge storage layer and the sacrificial film. The method further includes the steps of: embedding an element isolation insulating film into the element isolation trench while exposing the upper surface and the upper portion of the side surface of the charge storage layer to the outside; forming an inter-electrode insulating film on the upper surface of the element isolation insulating film, the side surface of the charge storage layer, and the upper surface of the sacrificial film; and forming a control gate electrode film on the inter-electrode insulating film. The method further includes the steps of: isolating and forming gate electrodes by processing the control gate electrode film, the inter-electrode insulating film, the sacrificial film, the charge storage layer and the gate insulating film; forming a cavity between the upper surface of the charge storage layer and the inter-electrode insulating film by removing the sacrificial film; and forming an inter-memory cell insulating film between the gate electrodes.

Descriptions will be hereinbelow provided for multiple embodiments by referring to the drawings. Incidentally, components which are substantially the same throughout the embodiments will be denoted by the same reference numerals, and descriptions of such components will be omitted. Note that the drawings are schematic and relationships between thicknesses and flat dimensions, as well as ratios among the thicknesses of the respective layers, are different from the actual ones.

First Embodiment

First of all, FIG. 1 is an example of a representative circuit schematic showing a part of a memory cell array formed in a memory cell region of a NAND flash memory device of a first embodiment. As shown in FIG. 1, the memory cell array of the NAND flash memory device includes NAND cell units SU formed in a matrix layout. Each NAND cell unit SU includes two selection gate transistors Trs 1, Trs 2, and multiple (for example, 64) memory cell transistors Trm connected in series between the selection gate transistors Trs1, Trs2. In the NAND cell unit SU, the multiple memory cell transistors Trm are formed in such a manner that each pair of the neighboring memory cell transistors Trm share a source/drain region.

The memory cell transistors Trm arranged in the same row extending in an X direction (corresponding to a word line direction and a gate width direction) in FIG. 1 are connected to one another by a word line WL. In addition, the selection gate transistors Trs1 arranged in the same row extending in the X direction in FIG. 1 are connected to one another by a selection gate line SGL1, while the selection gate transistors Trs2 arranged in the same row extending in the X direction are connected to one another by a selection gate line SGL2. A bit line contact CB is connected to the drain region of each selection gate transistor Trs1. The bit line contact CB is connected to a corresponding bit line BL extending in a Y direction (corresponding to a gate length direction and a bit line direction) orthogonal to the X direction in FIG. 1. Furthermore, each selection gate transistor Trs2 is connected to a corresponding source line SL extending in the X direction in FIG. 1 via the source region of the selection gate transistor Trs2.

Figure 2:
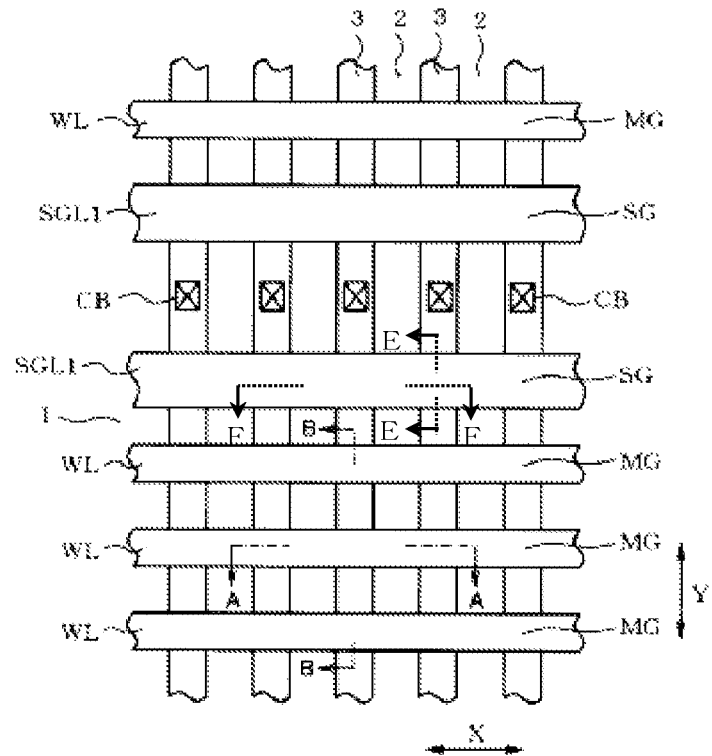
FIG. 2A is a schematic plan view showing an example of a layout pattern of a part of a memory cell region.
FIG. 2B is a schematic plan view showing an example of a layout pattern of a part of a peripheral circuit region.
Figure 2:
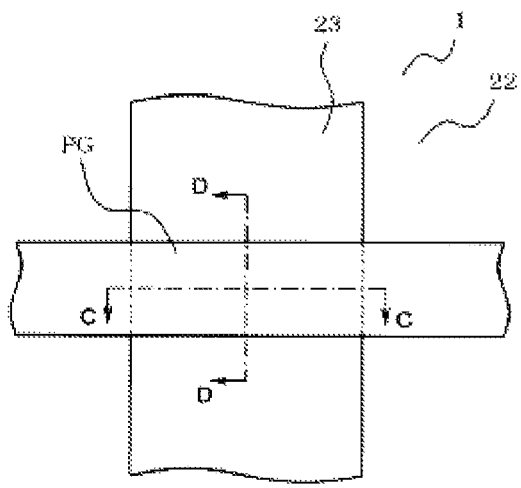

FIG. 2A is an example of a plan view showing a layout pattern of a part of the memory cell region, and FIG. 2B is an example of a plan view showing a layout pattern of a part of a peripheral circuit region. First of all, in the memory cell region shown in FIG. 2A, as element isolation regions, multiple STIs (shallow trench isolations) 2 extending in the Y direction in FIG. 2A are formed in a silicon substrate 1 as a semiconductor substrate at predetermined intervals in the X direction in FIG. 2A. Thereby, element regions 3 extending in the Y direction in FIG. 2A are formed in a way that the element regions 3 are isolated from each other in the X direction in FIG. 2A. Multiple word lines WL of the memory cell transistors are formed in a way that extends in a direction orthogonal to the element regions 3 (i.e., in the X direction in FIG. 2A), and at predetermined intervals in the Y direction in FIG. 2A.

In addition, a pair of the selection gate lines SGL1 of the selection gate transistors are formed in a way that extends in the X direction in FIG. 2A. The bit line contacts CB are formed in the respective element regions 3 between the paired selection gate lines SGL1. The gate electrodes MG of the memory cell transistors are formed on the intersections between the element regions 3 and the word lines WL, respectively. The gate electrodes SG of the selection gate transistors are formed on the intersections between the element regions 3 and the selection gate lines SGL1, respectively.

Figure 3:
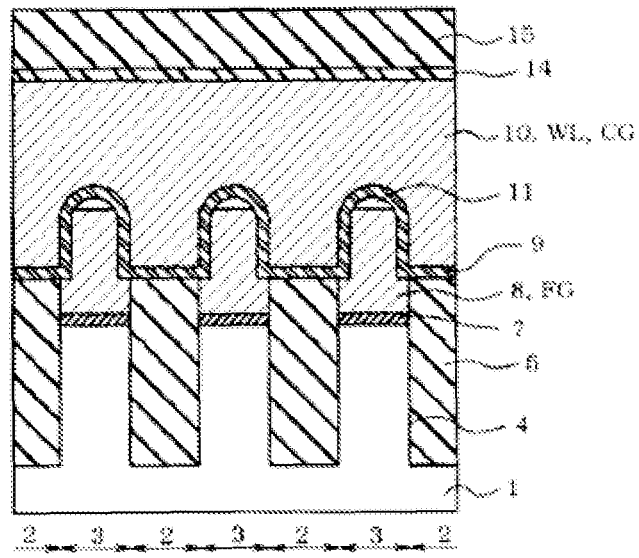
FIG. 3A is an example of a schematic cross-sectional diagram showing the part of the memory cell region taken along the A-A line of FIG. 2A.
FIG. 3B is an example of a schematic cross-sectional diagram showing the part of the memory cell region taken along the B-B line of FIG. 2A.
Figure 3:
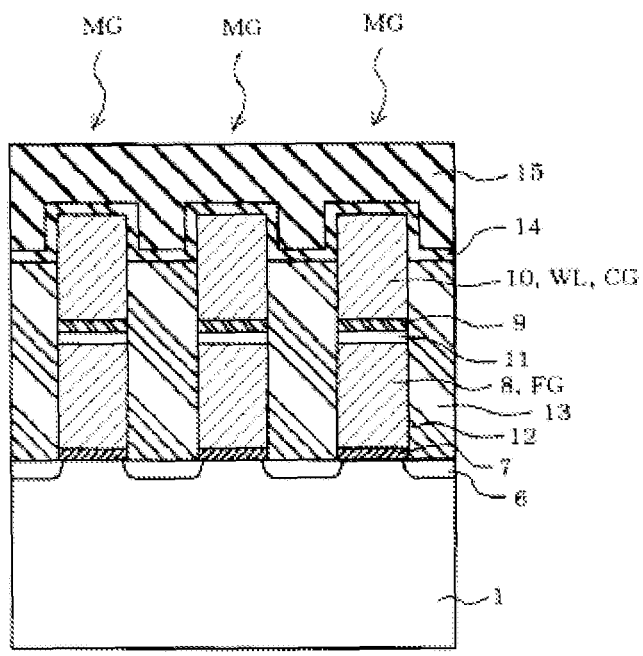

Furthermore, in the peripheral circuit region shown in FIG. 2B, STIs 22 as the element isolation regions are formed in the silicon substrate 1 as in the case of the memory cell region. Element regions 23 as element forming regions are formed in the silicon substrate 1 in a way that the element regions 23 are isolated from each other by the STIs 22. Gate electrodes PG (peripheral gate electrodes) are formed in a direction orthogonal to the element regions 23. Transistors for the peripheral circuit are formed in intersections between the gate electrodes PG and the element regions 23, respectively. Such transistors are formed in other parts of the peripheral circuit region. These transistors are formed as various transistors, such as a high breakdown voltage transistor and a low breakdown voltage transistor, for driving the memory cell transistors Trm in the memory cell FIG. 3A is an example of a diagram schematically showing a cross-sectional structure of memory cells in the word line direction (i.e., the gate width direction) (which is a cross-sectional diagram of the memory cells taken along the A-A line of FIG. 2A). FIG. 3B is an example of a diagram schematically showing a cross-sectional structure of the memory cells in the bit line direction (i.e., the gate length direction) (which is a cross-sectional diagram of the memory cells taken along the B-B line of FIG. 2A). Referring to FIGS. 3A and 3B, descriptions will be provided for the structure of the gate electrodes in the memory cell region of this embodiment.

As shown in FIGS. 3A and 3B, multiple element isolation trenches 4 are formed in the upper portion of the p-type silicon substrate 1 at intervals in the X direction. These element isolation trenches 4 isolate the element regions 3 in the X direction in FIG. 1. An element isolation insulating film 5 is formed in each element isolation trench 4, and functions as the element isolation region (STI (shallow trench isolation)) 2. The element isolation insulating film 5 includes: a liner oxide film formed on the inner surface of the element isolation trench 4; and a coated oxide film formed on the liner oxide film.

Each memory cell transistor includes; n-type diffusion layers 6 formed in the silicon substrate 1; a gate insulating film 7 formed on the silicon substrate 1; and gate electrodes MG formed on the gate insulating film 7. Each gate electrode MG includes: a floating gate electrode film FG serving as a charge storage layer; an inter-electrode insulating film 9 formed on the floating gate electrode film FG; and a control gate electrode film CG (a control electrode layer) formed on the inter-electrode insulating film 9. The diffusion layers 6 are formed in a way that is situated on the respective two sides of the gate electrode MG of the memory cell transistor on the silicon substrate 1, and each diffusion layer 6 functions as a source/drain region of the memory cell transistor.

The gate insulating film (tunnel insulating film) 7 is formed on the silicon substrate 1 (the element region 3). A silicon oxide film, for example, is used as the gate insulating film 7. A polycrystalline silicon layer (conductive layer) 8 doped with an impurity like phosphorus, for example, is used as the floating gate electrode film FG.

The inter-electrode insulating film 9 is formed along the upper surface of the element isolation insulating film 5, the upper side surface of the floating gate electrode film FG, and the upper surface of the floating gate electrode film FG. The inter-electrode insulating film 9 functions as an interpoly insulating film, an inter-conductive layer insulating film, and an insulating film between electrodes. In this respect, a cavity 11 is provided between the upper surface of the floating gate electrode film FG and the inter-electrode insulating film 9. The vertical dimension of the cavity 11 in FIGS. 3A and 3B is set at no more than 5 nm, for example. Incidentally, a film with a stacked structure of a silicon oxide film/a silicon nitride film/a silicon oxide film, namely a so-called ONO stacked structure, is used as the inter-electrode insulating film 9, for example.

The control gate electrode film CG includes a conductive layer 10 functioning as the word line WL of the memory cell transistor. This conductive layer 10 (word line WL) connects the control gate electrode films CG of the respective memory cell transistors Trm. The conductive layer 10 has a stacked structure in which, for example, a silicide layer is stacked on a polycrystalline silicon layer. The polycrystalline silicon layer is doped with an impurity like phosphorus. The silicide layer is formed immediately on the polycrystalline silicon layer, and is silicided with a metal of any one of tungsten (W), cobalt (Co), nickel (Ni), and the like. In this embodiment, nickel silicide (NiSi), for example, is used for the silicide layer. Alternatively, the conductive layer 10 may be entirely formed from the silicide layer (that is to say, the conductive layer 10 may be formed from the silicide layer alone).

Furthermore, as shown in FIG. 3B, the gate electrodes MG of the respective memory cell transistors are arranged side-by-side in the Y direction. The gate electrodes MG are electrically isolated from one another by electrode isolation trenches 12. An inter-memory cell insulating film 13 is formed in each trench 12. Either a silicon oxide film formed by using TEOS (tetraethyl orthosilicate) or a low-permittivity insulating film is used as the inter-memory cell insulating film 13.

A liner insulating film 14 using a silicon nitride film, for example, is formed on the upper surface of the inter-memory cell insulating film 13, as well as on the side surface and the upper surface of the control gate electrode film CG. An interlayer dielectric film 15 using a silicon oxide film, for example, is formed on the liner insulating film 14. The liner insulating film 14 has a function of preventing an oxidant from reaching the control gate electrode film CG while the interlayer dielectric film 15 using the silicon oxide film is formed, and particularly preventing the word line WL from becoming higher in resistance due to the oxidation of the silicide layer of the conductive layer 10. Moreover, because of the structure in which the liner insulating film 14 is not completely embedded in the interstices between the control gate electrode films CG, it is possible to reduce the influence of wiring delay resulting from an increase in parasitic capacitance.

The non-volatile semiconductor memory device having the above-described configuration, for example, is configured to be capable of erasing and writing data from and onto some of the memory cells selected by particular ones of the peripheral circuits, albeit not illustrated, applying a high-voltage electric field to parts between the word line WL and corresponding ones of the p-wells in the silicon substrate 1, and applying appropriate voltages to corresponding ones of the electric elements (sources/drains). In this case, for data writing, particular peripheral circuits apply a high voltage to the word lines WL (control gate electrode films CG) which are selected for the data writing, and apply a low voltage to corresponding ones of the p-wells in the silicon substrate 1. Meanwhile, for data erasing, particular peripheral circuits apply the low voltage to word lines WL (control gate electrode films CG) which are objects of the data erasing, and apply the high voltage to corresponding ones of the p-wells in the silicon substrate 1.

Figure 4:
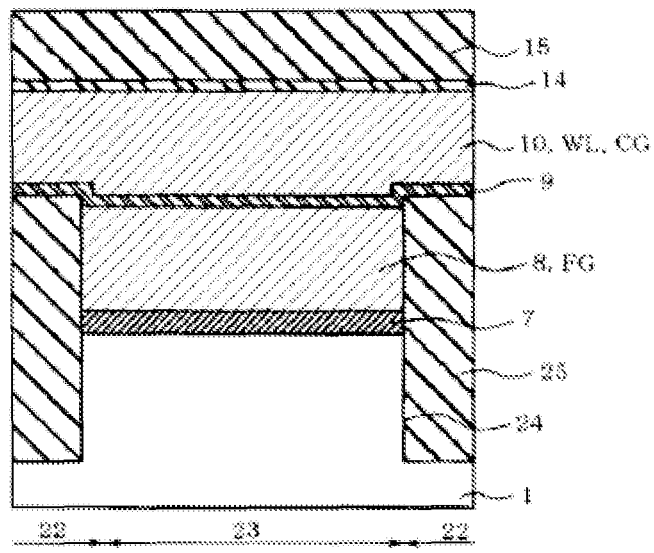
FIG. 4A is an example of a schematic cross-sectional diagram showing the part of the peripheral circuit region taken along the C-C line of FIG. 2B.
FIG. 4B is an example of a schematic cross-sectional diagram showing the part of the peripheral circuit region taken along the D-D line of FIG. 2B.
Figure 4:
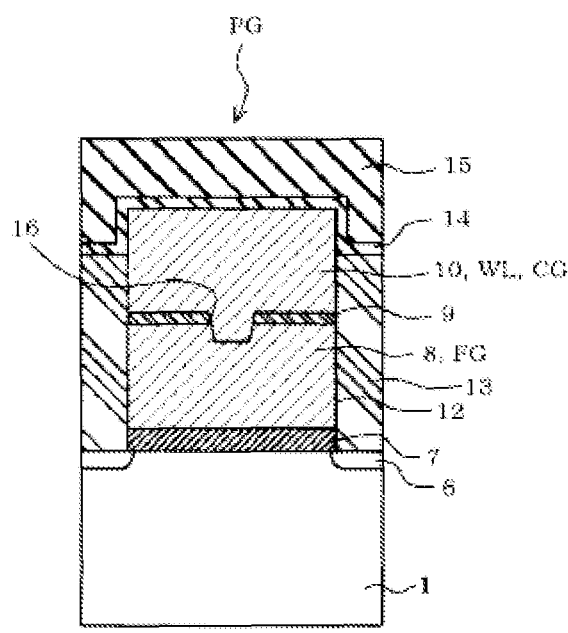
Figure 5:
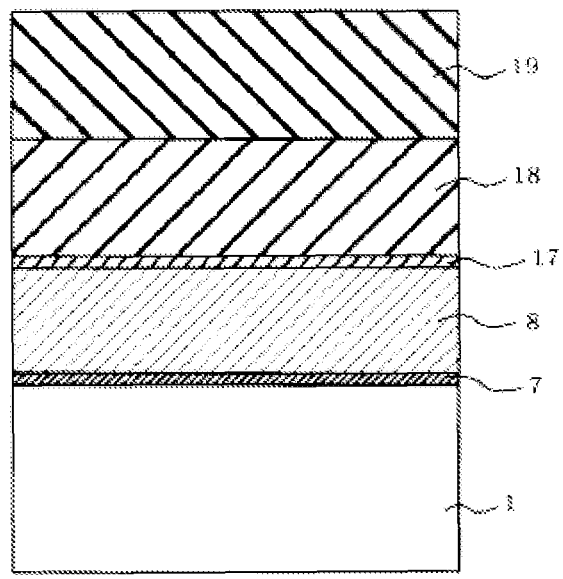
FIG. 5A is an example of a cross-sectional diagram (Part 1) showing the part of the memory cell region in the process of being manufactured, which is taken along the A-A line of FIG. 2A.
FIG. 5B is an example of a cross-sectional diagram (Part 1) showing the part of the memory cell region in the process of being manufactured, which is taken along the B-B line of FIG. 2A.
Figure 5:
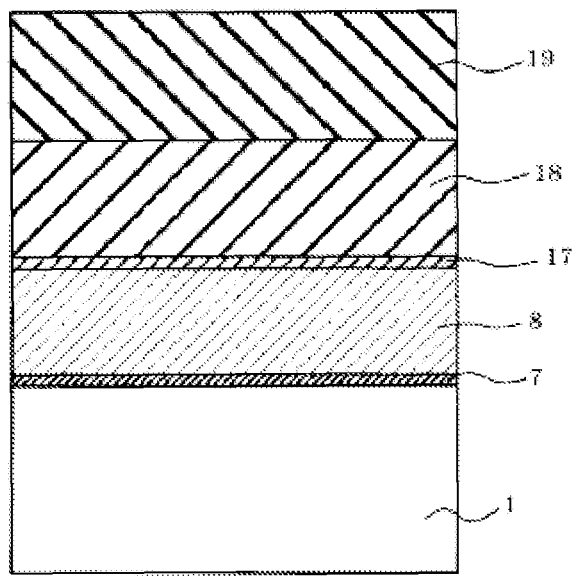

In addition, descriptions will be provided for the structure of a gate electrode in the peripheral circuit region by referring to FIGS. 4A and 4B. FIG. 4A is an example of a cross-sectional view of the gate electrode taken along the C-C line of FIG. 2B, and FIG. 4B is an example of a cross-sectional view of the gate electrode taken along the D-D line of FIG. 2B. As shown in FIGS. 4A and 4B, the STIs (element isolation regions) 22 are formed in the upper portion of the substrate 1 at predetermined intervals. The active regions (element forming regions) 23 are isolated from one another by the STIs 22.

Each STI 22 includes: an element insulation trench 24 whose opening width is larger than that of the element isolation trench 4 of each STI 2 in the memory cell region; and an element isolation insulating film 25 formed in the element isolation trench 24. The element isolation insulating film 25 includes: a liner oxide film formed on the side portion of the inner surface of the element isolation trench 24; and a coated oxide film formed on the liner oxide film.

A high breakdown voltage transistor gate insulating film 7, whose film thickness is thicker than that of the gate insulating film 7 of each memory cell transistor 7, is formed on each element layer 23. A silicon oxide film, for example, is used as the gate insulating film 7. As in the case of each memory cell transistor, a floating gate electrode film FG (a polycrystalline silicon layer 8), an inter-electrode insulating film 9 and a control gate electrode film CG, which constitute a gate electrode PG, are stacked on the gate insulating film 7. In this respect, the inter-electrode insulating film 9 is formed directly on the upper surface of the floating gate electrode film FG. No cavity 11, which is formed in each gate electrode MG in the memory cell region, is formed in the gate electrode PG.

Moreover, an opening 16 is formed in the inter-electrode insulating film 9. The control gate electrode film CG and the floating gate electrode film FG are electrically conductive to each other through the opening 16. In addition, no cavity is formed between the floating gate electrode film FG and the inter-electrode insulating film 9. In other words, the upper surface of the floating gate electrode film FG and the lower surface of the inter-electrode insulating film 9 are in direct contact with each other. Moreover, the gate electrodes PG are electrically isolated from one another by electrode isolation trenches 12. An inter-memory cell insulating film 13 is formed in each electrode isolation trench 12. A liner insulating film 14 using a silicon nitride film, for example, is formed on the upper surface of the inter-memory cell insulating film 13, as well as on the side surface and the upper surface of the control gate electrode film CG. An interlayer dielectric film 15 using a silicon oxide film, for example, is formed on the liner insulating film 14.

Descriptions will be provided hereinbelow for a method of manufacturing a non-volatile semiconductor memory device having the above-described configuration by referring to FIG. 5A through FIG. 21B. Incidentally, FIGS. 5A, 5B, 7A, 7B, 9A, 9B, 12A, 12B, 13A, 13B, 15A, 15B, 17A, 17B, 19A, 19B, 21A and 21B are examples of cross-sectional views schematically showing a method of manufacturing the memory cell region in the non-volatile semiconductor memory device. FIGS. 5A, 7A, 9A, 12A, 13A, 15A, 17A, 19A and 21A are examples of a cross-sectional view of the memory cell region taken along the A-A line of FIG. 2A. FIGS. 5B, 7B, 9B, 12B, 13B, 15B, 17B, 19B, and 21B are examples of a cross-sectional view of the memory cell region taken along the B-B line of FIG. 2A. FIGS. 6, 8, 10, 11, 14, 16, 18 and 20 are cross-sectional views schematically showing a method of manufacturing the peripheral circuit region in the non-volatile semiconductor memory device, and are examples of a cross-sectional view of the peripheral circuit region taken along the C-C line of FIG. 2B.

Figure 6:
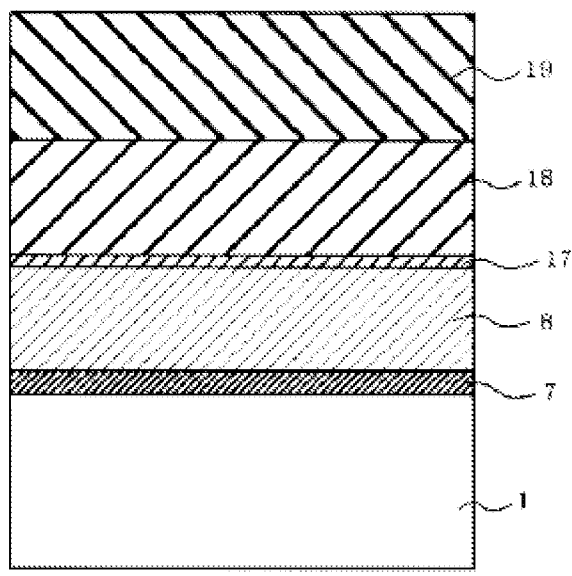
FIG. 6 is an example of a cross-sectional diagram (Part 1) showing the part of the peripheral circuit region in the process of being manufactured, which is taken along the C-C line of FIG. 2B.
Figure 7:
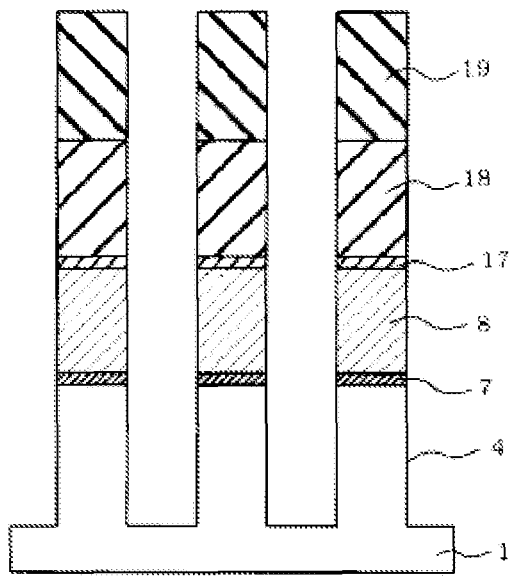
FIG. 7A is an example of a cross-sectional diagram (Part 2) showing the part of the memory cell region in the process of being manufactured, which is taken along the A-A line of FIG. 2A.
FIG. 7B is an example of a cross-sectional diagram (Part 2) showing the part of the memory cell region in the process of being manufactured, which is taken along the B-B line of FIG. 2A.
Figure 7:
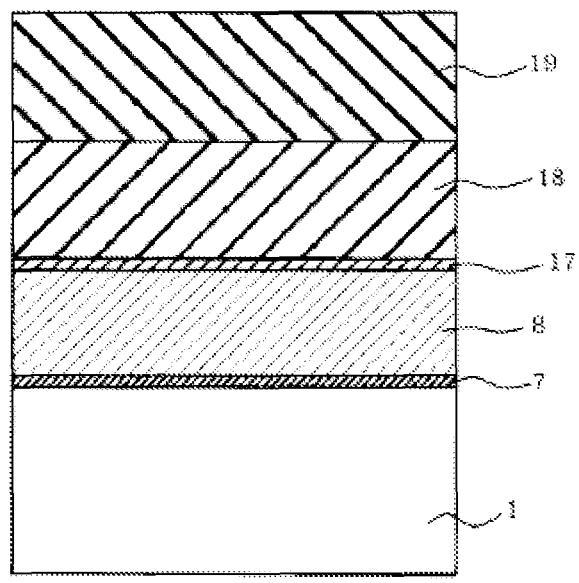
Figure 8:
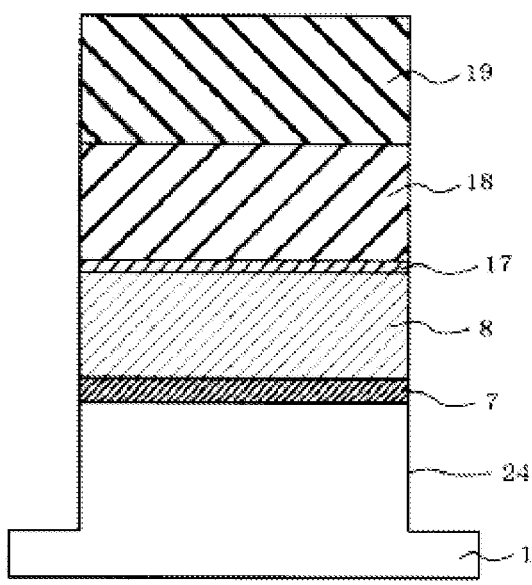
FIG. 8 is an example of a cross-sectional diagram (Part 2) showing the part of the peripheral circuit region in the process of being manufactured, which is taken along the C-C line of FIG. 2B.
Figure 9:
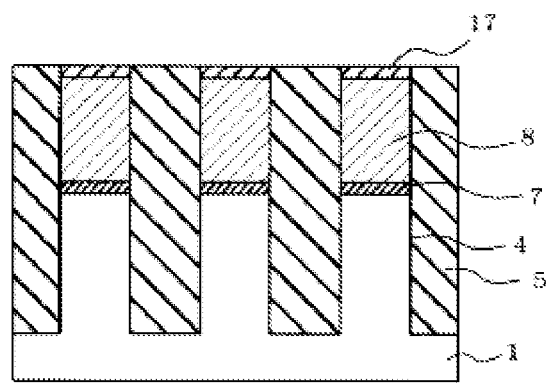
FIG. 9A is an example of a cross-sectional diagram (Part 3) showing the part of the memory cell region in the process of being manufactured, which is taken along the A-A line of FIG. 2A.
FIG. 9B is an example of a cross-sectional diagram (Part 3) showing the part of the memory cell region in the process of being manufactured, which is taken along the B-B line of FIG. 2A.
Figure 9:
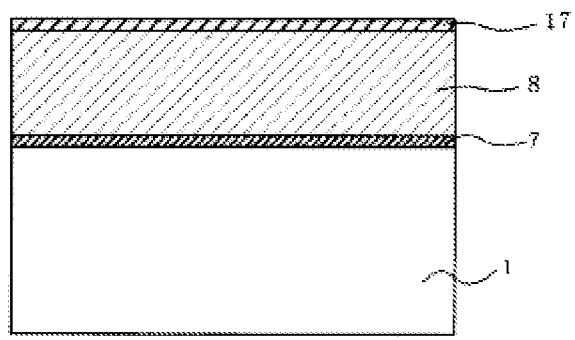
Figure 10:
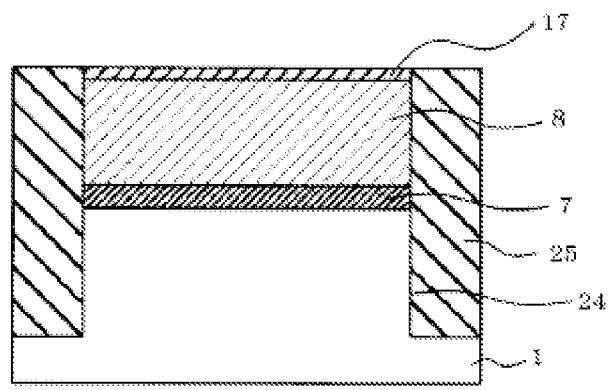
FIG. 10 is an example of a cross-sectional diagram (Part 3) showing the part of the peripheral circuit region in the process of being manufactured, which is taken along the C-C line of FIG. 2B.

As shown in FIGS. 5A, 5B and 6, the gate insulating film 7 as the tunnel insulating film is formed on the upper surface of the silicon substrate 1, which is doped with the impurity, by thermal oxidation. Incidentally, the film thickness of the gate insulating film 7 in the memory cell region is approximately 6 nm, for example. The film thickness of the gate insulating film 7 in the peripheral circuit region is thicker than that of the gate insulating film 7 in the memory cell region. A phosphorus-doped polycrystalline silicon layer 8 serving as the floating gate electrode film FG (the charge storage layer) is formed with a thickness of approximately 100 nm, for example, on the gate insulating film 7 by CVD (chemical vapor deposition).

A sacrificial film 17 used to form the cavity 11 is formed with a film thickness of not more than 5 nm, for example, on the polycrystalline silicon layer 8. The sacrificial film 17 may be a film made of a material which makes the etching selectivity to the oxide film and the silicon film larger. A silicon nitride film, for example, may be used as the sacrificial film 17. Otherwise, a film made of a metal or the like, relatively easy to process, and making the etching selectivity larger may be used as the sacrificial film 17. Examples of such a film include tungsten nitride (WN).

A silicon nitride film 18 as a mask film is formed by CVD. In addition, a silicon oxide film 19 as another mask film is formed by CVD. A photoresist (not illustrated) is applied to the top of the silicon oxide film 19. Subsequently, the photoresist is patterned by exposure and development.

The silicon oxide film 19 is etched by RIE (reactive ion etching) using the patterned photoresist as an anti-etching mask (a first resist mask). After the etching, the photoresist is removed and the silicon nitride film 18 is etched by RIE using the resultant silicon oxide film 19 as a mask. The trenches (element isolation trenches) 2, 24 for isolating the elements from one another are formed by etching the sacrificial film 17, the polycrystalline silicon layer 8 (the floating gate electrode film FG), the gate insulating film 7 and the silicon substrate 1 by RIE (see FIGS. 7A, 7B and 8). In this case, both the width dimension of the element regions 3 in the memory cell region and the width dimension of the element isolation regions 4 therein are approximately 50 nm, for example.

As the element isolation insulating films 5, 25, a silicon oxide film is formed on the silicon oxide film 19 and in the element isolation trenches 4, 24 by using polysilazane coating or the like, for example. Thereby, the silicon oxide film is embedded into the element isolation trenches 4, 24. The silicon oxide film 19 is removed from the top of the silicon nitride film 18, and parts of the silicon oxide film (the element isolation insulating films) 5, 25 are left in the element isolation trenches 4, 24, by planarization by CMP (chemical mechanical polishing) using the silicon nitride film 18 as a stopper. The silicon nitride film 18 as the mask material is removed (exfoliated) by etching using a chemical solution or the like, for example. Thereby, the upper surface of the sacrificial film 17 is exposed to the outside (see FIGS. 9A, 9B and 10).

Figure 11:
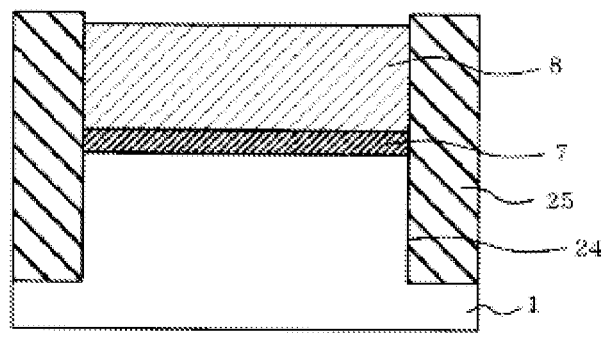
FIG. 11 is an example of a cross-sectional diagram (Part 4) showing the part of the peripheral circuit region in the process of being manufactured, which is taken along the C-C line of FIG. 2B.
Figure 12:
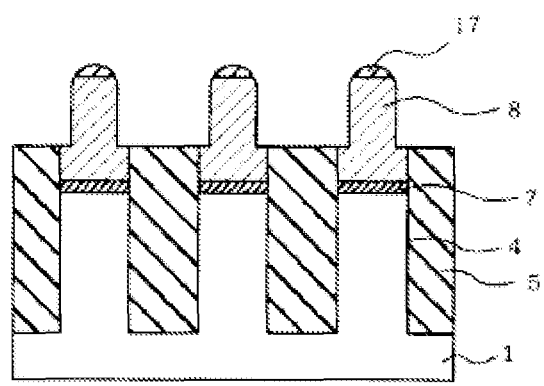
FIG. 12A is an example of a cross-sectional diagram (Part 4) showing the part of the memory cell region in the process of being manufactured, which is taken along the A-A line of FIG. 2A.
FIG. 12B is an example of a cross-sectional diagram (Part 4) showing the part of the memory cell region in the process of being manufactured, which is taken along the B-B line of FIG. 2A.
Figure 12:
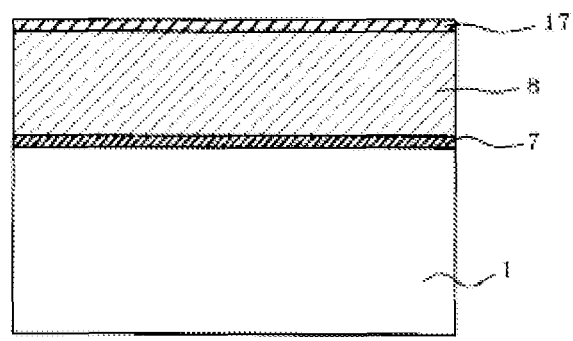
Figure 13:
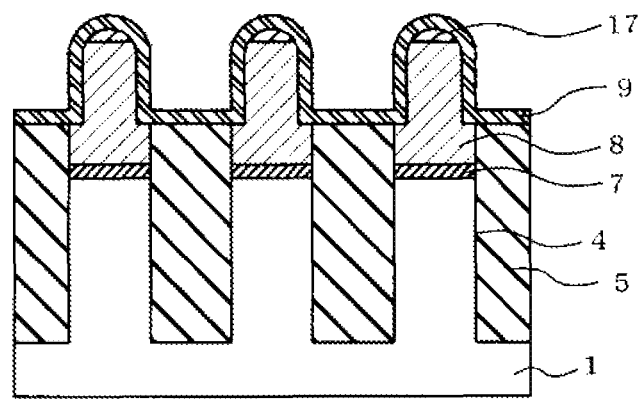
FIG. 13A is an example of a cross-sectional diagram (Part 5) showing the part of the memory cell region in the process of being manufactured, which is taken along the A-A line of FIG. 2A.
FIG. 13B is an example of a cross-sectional diagram (Part 5) showing the part of the memory cell region in the process of being manufactured, which is taken along the B-B line of FIG. 2A.
Figure 13:
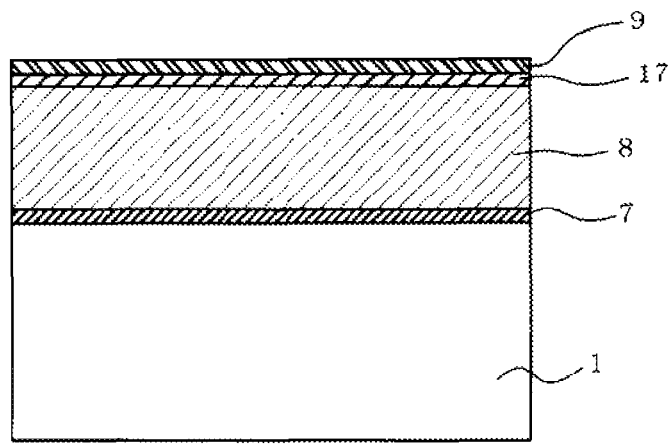

As for the peripheral circuit region, the sacrificial film 17 is removed by etching, and the upper surface of the polycrystalline silicon layer 8 is exposed to the outside (see FIG. 11). During this process, the memory cell region is masked with a photoresist or the like so that the sacrificial film 17 should not be removed from there.

As for the memory cell region, upper portions of the silicon oxide film (the respective element isolation insulating films) 5 are removed by etching using a dilute hydrofluoric acid solution, for example. During this process, the element isolation insulating films 5 are etched until upper portions of the side surfaces of the polycrystalline silicon layers 8 are exposed to the outside. The height of the exposed side portions is approximately 50 nm, for example. Thereby, a structure shown in FIGS. 12A and 12B is obtained. During this process, the peripheral circuit region is masked with a resist or the like so that the element isolation insulating films 5 should not be removed. It is likely that the upper surfaces of the sacrificial films 17 become rounded, and the extremity of each of the sacrificial films 17 have a pointed shape.

Figure 14:
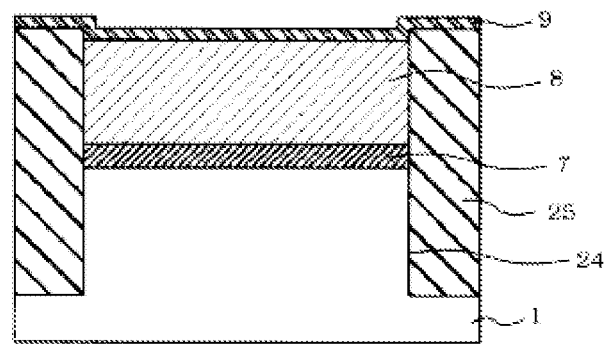
FIG. 14 is an example of a cross-sectional diagram (Part 5) showing the part of the peripheral circuit region in the process of being manufactured, which is taken along the C-C line of FIG. 2B.
Figure 15:
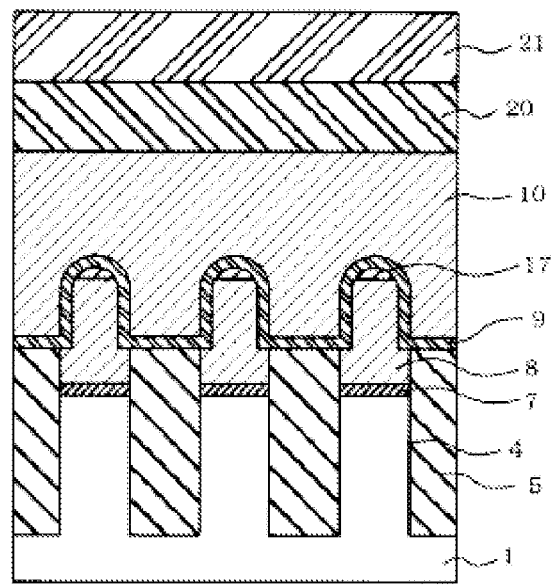
FIG. 15A is an example of a cross-sectional diagram (Part 6) showing the part of the memory cell region in the process of being manufactured, which is taken along the A-A line of FIG. 2A.
FIG. 15B is an example of a cross-sectional diagram (Part 6) showing the part of the memory cell region in the process of being manufactured, which is taken along the B-B line of FIG. 2A.
Figure 15:
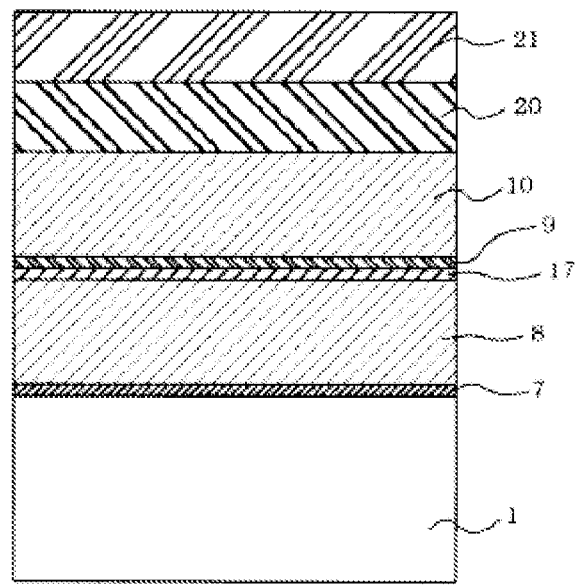

As shown in FIGS. 13A, 13B and 14, the inter-electrode insulating film 9 is formed on all the surfaces (that is to say, the upper surfaces of the element isolation insulating films 5, the upper side surfaces of the floating gate electrode films FG (the polycrystalline silicon layers 8) and the upper surfaces of the floating gate electrode films FG). This process is achieved by stacking a silicon oxide film, a silicon nitride film and a silicon oxide film in this order (that is to say, by forming a film having an ONO stacked structure) by LP-CVD (low pressure chemical vapor deposition), for example. Thereafter, the openings 16 (see FIG. 4B) are formed in: portions of the inter-electrode insulating film 9 which correspond to the upper surfaces of the floating gate electrode films FG (the polycrystalline silicon layers 8) in the peripheral circuit region; and portions (not illustrated) of the inter-electrode insulating film 9 which correspond to the upper surfaces of the floating gate electrode films FG (the polycrystalline silicon layers 8) of the selection gate electrodes SG in the memory cell region by a publicly-known processing method.

Figure 16:
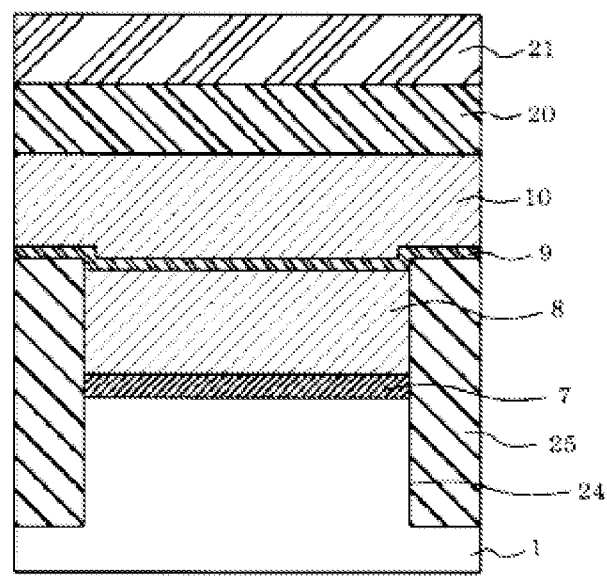
FIG. 16 is an example of a cross-sectional diagram (Part 6) showing the part of the peripheral circuit region in the process of being manufactured, which is taken along the C-C line of FIG. 2B.
Figure 17:
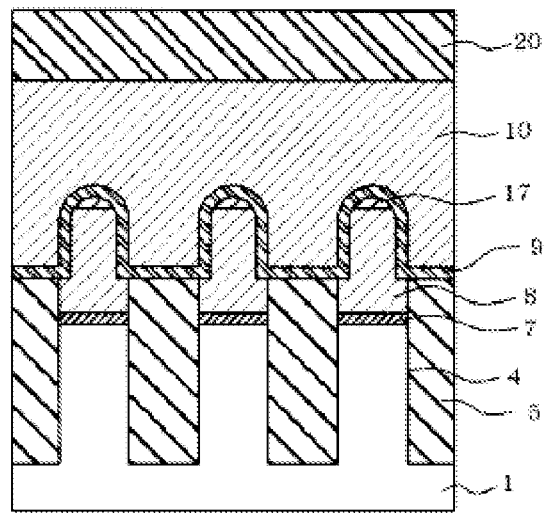
FIG. 17A is an example of a cross-sectional diagram (Part 7) showing the part of the memory cell region in the process of being manufactured, which is taken along the A-A line of FIG. 2A.
FIG. 17B is an example of a cross-sectional diagram (Part 7) showing the part of the memory cell region in the process of being manufactured, which is taken along the B-B line of FIG. 2A.
Figure 17:
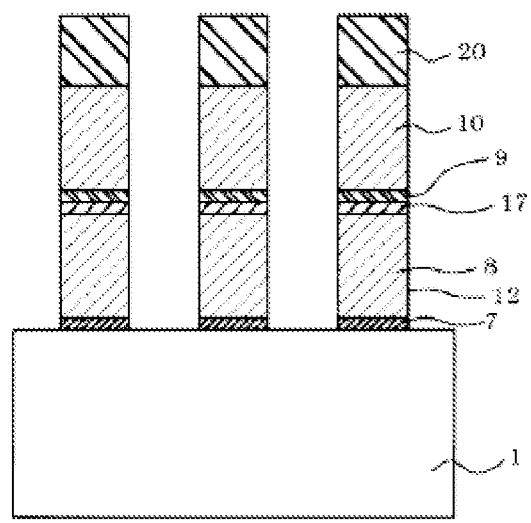
Figure 18:
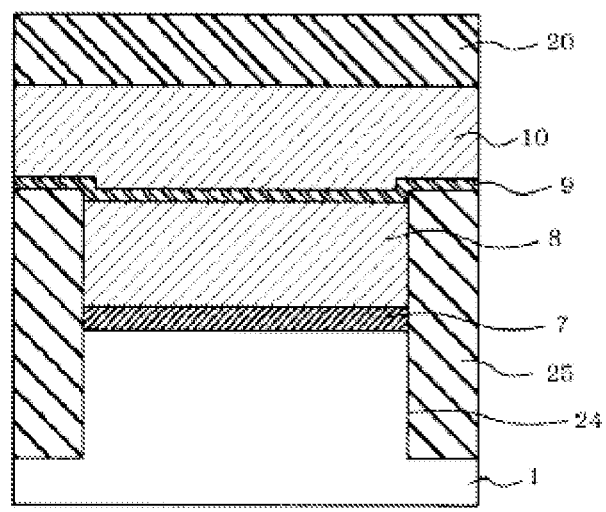
FIG. 18 is an example of a cross-sectional diagram (Part 7) showing the part of the peripheral circuit region in the process of being manufactured, which is taken along the C-C line of FIG. 2B.
Figure 19:
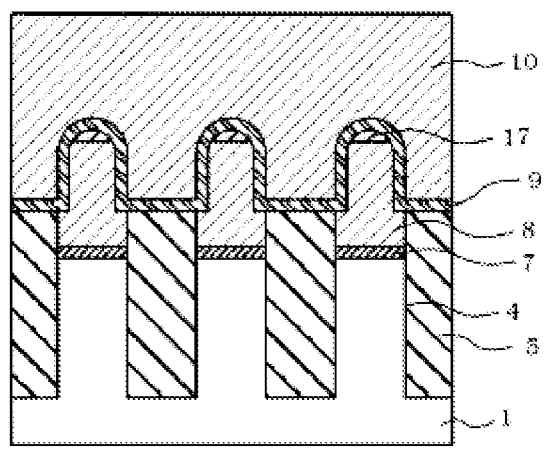
FIG. 19A is an example of a cross-sectional diagram (Part 8) showing the part of the memory cell region in the process of being manufactured, which is taken along the A-A line of FIG. 2A.
FIG. 19B is an example of a cross-sectional diagram (Part 8) showing the part of the memory cell region in the process of being manufactured, which is taken along the B-B line of FIG. 2A.
Figure 19:
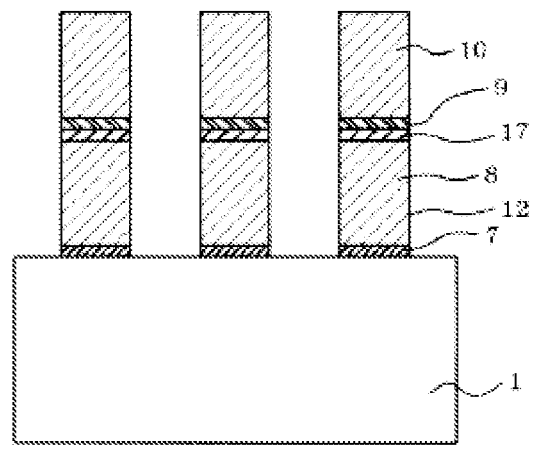

As shown in FIGS. 15A, 15B and 16, a phosphorus-doped polycrystalline silicon layer 10 serving as the control gate electrode films CG is formed with a thickness of approximately 100 nm, for example, on the inter-electrode insulating film 9 using LP-CVD, for example. As mask films used for RIE, a silicon nitride film 20 and a silicon oxide film 21 are stacked on the polycrystalline silicon layer 10 by CVD, for example.

Figure 20:
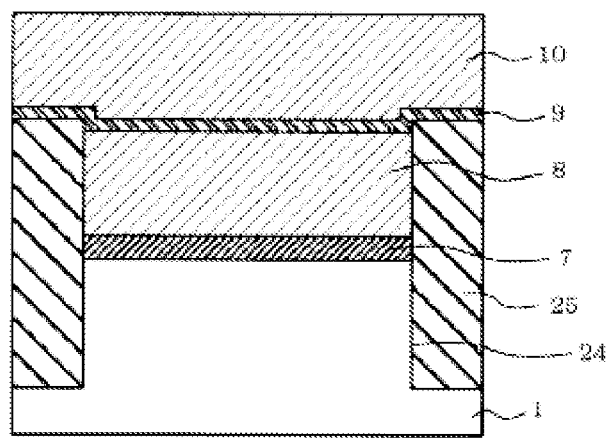
FIG. 20 is an example of a cross-sectional diagram (Part 8) showing the part of the peripheral circuit region in the process of being manufactured, which is taken along the C-C line of FIG. 2B.
Figure 21:
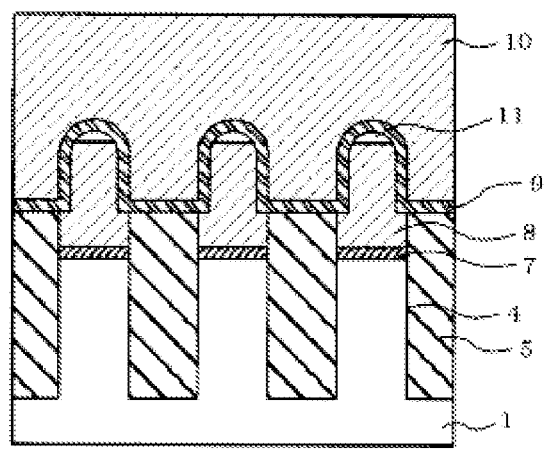
FIG. 21A is an example of a cross-sectional diagram (Part 9) showing the part of the memory cell region in the process of being manufactured, which is taken along the A-A line of FIG. 2A.
FIG. 21B is an example of a cross-sectional diagram (Part 9) showing the part of the memory cell region in the process of being manufactured, which is taken along the B-B line of FIG. 2A.
Figure 21:
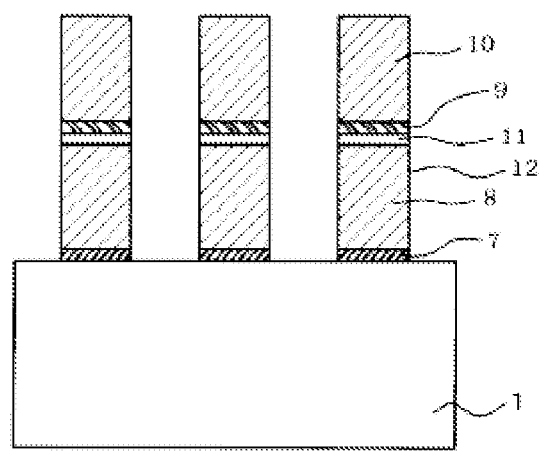

The gate electrodes MG in the memory cell region, the gate electrodes PG in the peripheral circuit region, and the like are isolated by gate processing (that is to say, by forming the element isolation trenches 12). To this end, a second resist mask (not illustrated) whose pattern is orthogonal to that of the first resist mask is formed on the silicon oxide film 21. The silicon oxide film 21 is etched by RIE using the second resist mask as the mask. After the etching, the resist is removed, and the silicon nitride film 20 is etched using the silicon oxide film 21 as the mask. The electrode isolation trenches 12 are formed by sequentially etching the polycrystalline silicon layer (conductive layer) 10, the inter-electrode insulating film 9, the sacrificial film 17, the polycrystalline silicon layers 8 and the gate insulating films 7 using the etched silicon nitride film 20 as the mask. Thereby, the gate electrodes MG in the memory cell region, the gate electrodes PG in the peripheral circuit region, and the like are isolated (see FIGS. 17A, 17B and 18). Both the width dimension of the gate electrodes MG and the dimension of the intervals between the gate electrodes MG in the memory cell region are approximately 50 nm, for example. The silicon nitride film 20 remaining on the polycrystalline film 10 is exfoliated, and the configuration shown in FIGS. 19A, 19B and 20 is obtained.

Since the sacrificial films 17 between the upper surfaces of the floating gate electrode films FG and the corresponding inter-electrode insulating films 9 in the memory cell region are exposed to the outside through the inner surfaces of the trenches 12, the sacrificial films 17 are removed by wet etching or the like. Thereby, the cavities 11 are formed (see FIGS. 21A and 21B). When the silicon nitride film, for example, is used as the sacrificial films 17, the sacrificial films 17 are removed by use of a high-temperature phosphoric acid. In addition, when a metal like WN, for example, is used as the sacrificial films 17, the sacrificial films 17 are removed by use of a liquid mixture of $H_2SO_4+H_2O_2$ (a SPM (sulphuric acid and hydrogen peroxide mixture) cleaning solution) or the like. In this case, it is likely that the upper surfaces of the floating gate electrode films FG become flat, and that the extremities of the inter-electrode insulating films 9 above the floating gate electrodes FG have a pointed shape.

Gate side wall films (not illustrated) with a film thickness of approximately 10 nm, for example, are formed by thermal oxidation and CVD. Impurity diffusion layers 6 serving as the source/drain regions (see FIGS. 3B and 4B) are formed by ion implantation and thermal annealing. The inter-memory cell insulating films 13 (see FIGS. 3B and 4B) are formed in the trenches 12. Thereby, the cavities 11 are contained between the upper surfaces of the floating gate electrode films FG and the inter-electrode insulating films 9 in the memory cell region. The inter-memory cell insulating films 13 are planarized, and are lowered in the trenches 12. Further, a nickel silicide layer is formed on the polycrystalline silicon layer 10. After that, as shown in FIGS. 3A, 3B, 4A and 4B, the liner insulating film 14 and the interlayer dielectric film 15 are formed. Subsequently, wiring and the like (not illustrated) are formed by use of a publicly-known technique.

The above-described steps makes it possible to obtain the NAND flash memory device including: the gate insulating films 7 formed on the silicon substrate (semiconductor substrate) 1; the floating gate electrode films FG formed on the gate insulating films 7; the inter-electrode insulating films 9 formed on the floating gate electrode films FG; the control gate electrode films CG formed on the inter-electrode insulating films 9; and the impurity diffusion layers 6 that interpose the channel regions under the floating gate electrode films FG in between.

In each memory cell transistor in the thus-obtained NAND flash memory device, once the high voltage is applied between the silicon substrate 1 and the control gate electrode film CG, an electric field in proportion to a coupling ratio is applied to the gate insulating film 7, and a tunnel current thus flows through the gate insulating film 7. As a result, the amount of charges stored in the floating gate electrode film FG changes and a threshold value of the memory cell changes accordingly. Thereby, data is written into or erased from the memory cell.

In the embodiment having the foregoing configuration, since the cavity 11 is formed between the upper surface of the floating gate electrode film FG and the inter-electrode insulating film 9 in each memory cell transistor, the film thickness of the insulating film (the inter-electrode insulating film 9 plus the cavity 11) between the floating gate electrode film FG and the control gate electrode film CG is thicker. For this reason, even if the extremity of the floating gate electrode film FG has a pointed shape due to micro-fabrication, or even if the extremity of the inter-electrode insulating film 9 on the floating gate electrode film FG has a pointed shape due to micro-fabrication, the concentration of the electric field which occurs in the pointed portion can be eased. This makes it possible to reduce a leakage current between the floating gate electrode film FG and the control gate electrode film CG. For this reason, the writing characteristic of the memory cell transistor can be enhanced.

Meanwhile, with regard to the peripheral circuit region, in a case where a capacitor is formed there and the inter-electrode insulating film 9 is used for the capacitor to accumulate electric charges, if the cavity 11 would be formed between the upper surface of the floating gate electrode film FG and the inter-electrode insulating film 9 and the film thickness of the insulating film (i.e., the inter-electrode insulating film 9 plus the cavity 11) between the floating gate electrode film FG and the control gate electrode film CG would thereby be made thicker, an effective capacitance C expressed with $C = \in \times (S/d)$ (where C denotes a capacitance, $\in$ denotes a permittivity, S denotes a surface area, and d denotes a film thickness of the insulating film) would become smaller. In this respect, if a necessary capacitance would be secured for the capacitor, it would be likely that the area of the capacitor increases and that the area of the NAND flash memory device chip increases.

Figure 23:
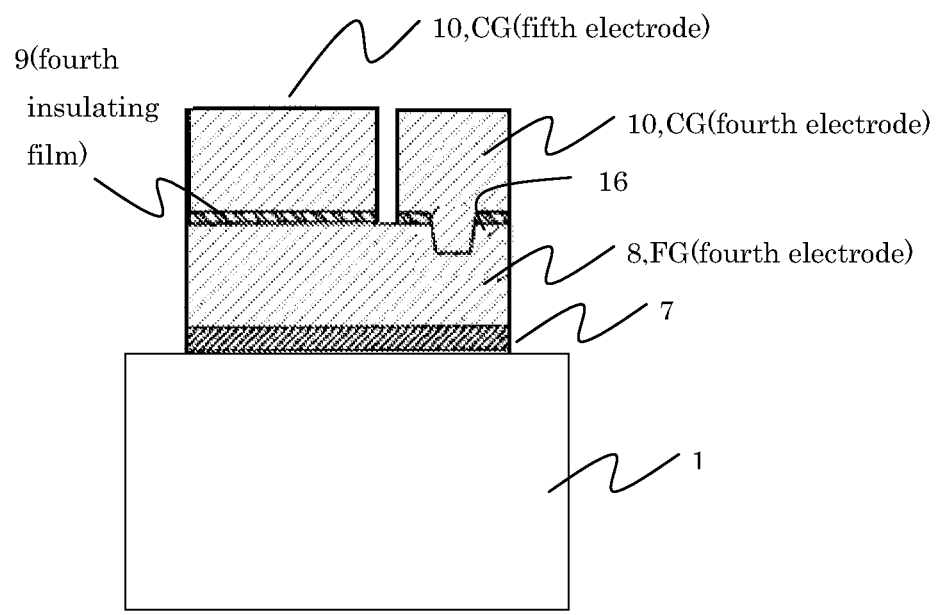
FIG. 23 is an example of a schematic cross-sectional diagram of a capacitor placed in the peripheral circuit region.
Figure 24:
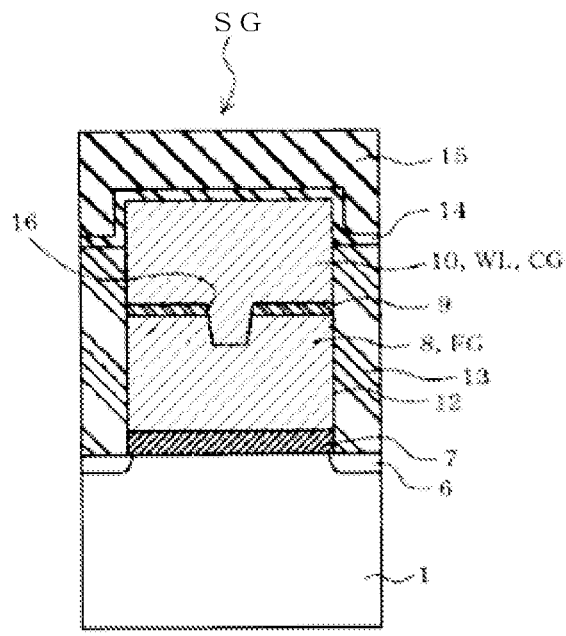
FIG. 24A is an example of a schematic cross-sectional diagram showing a part of the memory cell region taken along the E-E line of FIG. 2A.
FIG. 24B is an example of a schematic cross-sectional diagram showing a part of the memory cell region taken along the F-F line of FIG. 2A.
Figure 24:
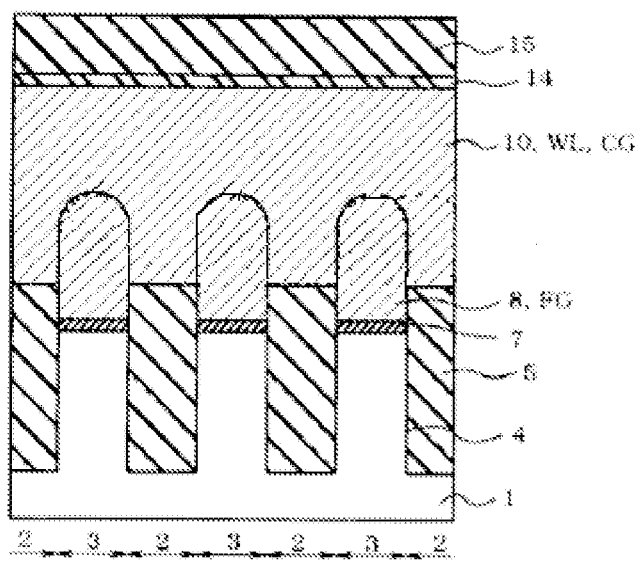

In contrast, in the embodiment, as shown in FIGS. 4A and 4B, no cavity 11 is formed between the upper surface of the floating gate electrode film FG and the inter-electrode insulating film 9 in the peripheral circuit region. For this reason, the film thickness of the insulating film (the inter-electrode insulating film 9) between the floating gate electrode film FG and the control gate electrode film CG does not become thicker. As a result, as shown in FIG. 23, when a capacitor element which uses the inter-electrode insulating film 9 as the capacitor is disposed in the peripheral circuit region, it is possible to inhibit an increase in the area of the capacitor and accordingly an increase in the area of the NAND flash memory device chip. For example, in the capacitor element, the upper surface of the floating gate electrode film FG and the undersurface of the inter-electrode insulating film 9 are in direct contact with each other, and the upper surface of the inter-electrode insulating film 9 and the control gate electrode film CG are in direct contact with each other.

Second Embodiment

Figure 22:
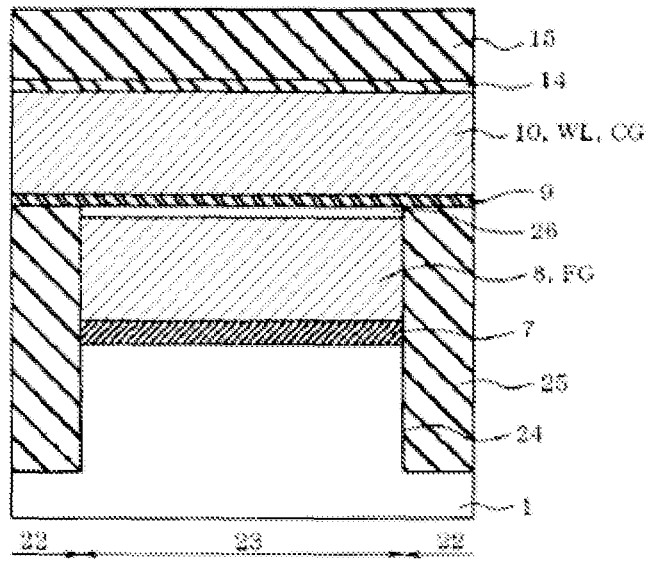
FIGS. 22A and 22B are an example of diagrams showing a second embodiment, which correspond to FIGS. 4A and 4B.
Figure 22:
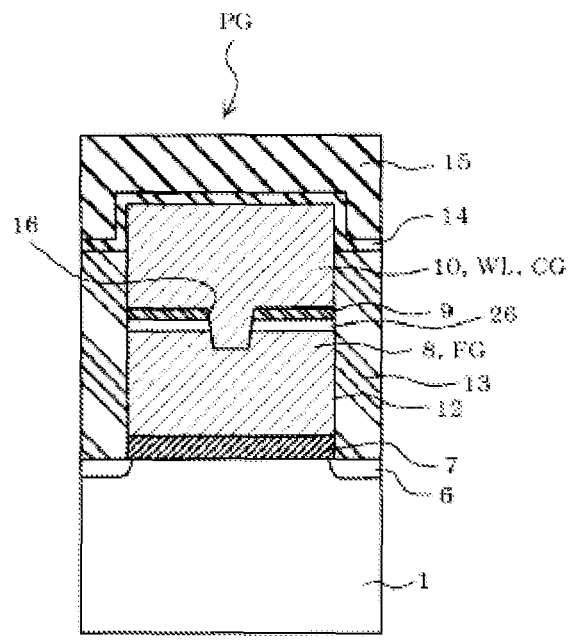

FIGS. 22A and 22B show a second embodiment. Components which are the same as those of the first embodiment are denoted by the same reference numerals. In the second embodiment, as shown in FIGS. 22A and 22B, each peripheral circuit transistor placed in the peripheral circuit region also has a configuration in which a cavity 26 is formed between the upper surface of a floating gate electrode film FG and an inter-electrode insulating film 9. In addition, the upper surface of the floating gate electrode film FG of the peripheral circuit transistor is lower than the upper surface of an element isolation insulating film 25 placed in the peripheral circuit region. Furthermore, the undersurface of the inter-electrode insulating film 9 of the peripheral circuit transistor is almost as high as the upper surface of the element isolation insulating film 25 placed in the peripheral circuit region. In other words, the upper surface of the cavity 26 is almost as high as the upper surface of the element isolation insulating film 25 placed in the peripheral circuit region. Moreover, part of a control gate electrode film CG, which is placed in an opening 16, is formed in a way that penetrates the inter-electrode insulating film 9 and the cavity 26, and is electrically conductive to the floating gate electrode film FG. The configuration of the second embodiment, except for what has been described above in terms of the peripheral circuit region, is the same as the configuration of the first embodiment.

For this reason, the second embodiment can obtain almost the same operation and effects as those of the first embodiment. Particularly, the second embodiment makes it possible to eliminate the steps (photolithography, etching, etc. steps) of removing the sacrificial film 17 formed on the upper surface of the floating gate electrode film FG in the peripheral circuit region, since, in the peripheral circuit region, the cavity 26 is formed between the upper surface of the floating gate electrode film FG and the inter-electrode insulating film 9.

Other Embodiments

In addition to the foregoing multiple embodiments, the following configuration may be adopted.

With regard to each of the forgoing embodiments, as shown in FIGS. 2A, 2B, 24A and 24B, in the memory cell region, the cavity 11 is formed between the upper surface of the floating gate electrode film FG and the inter-electrode insulating film 9 in each memory cell transistor and each selection gate transistor. Instead, a configuration may be employed in which no cavity 11 is formed between the upper surface of the floating gate electrode film FG and the inter-electrode insulating film 9 in each selection gate transistor.

In addition, in each of the foregoing embodiments, the sacrificial film 17 (see FIGS. 5A and 5B) is formed on the floating gate electrode film FG for the purpose of forming the cavity 11 between the upper surface of the floating gate electrode film FG and the inter-electrode insulating film 9. However, when the silicon nitride film is uses as the sacrificial film, a configuration may be used in which, instead of forming the sacrificial film 17 on the floating gate electrode film FG, the silicon nitride film 18 and the silicon oxide film 19 as the masks are stacked on the floating gate electrode film FG; the element isolation trenches 4 are formed; and thereafter, when the silicon nitride film 18 is removed, part of the silicon nitride film 18 is left with a thickness necessary enough to serve as the sacrificial film on the upper surface of the floating gate electrode film FG.

Furthermore, in each of the foregoing embodiments, the film having the ONO stacked structure including the silicon oxide film, the silicon nitride film and the silicon oxide film is used as the inter-electrode insulating film 9. The inter-electrode insulating film 9, however, is not limited to this structure. Here, an NONON film, an NONO film or an ONON film may be used instead. Otherwise, a film having a stacked structure of a silicon oxide film, a high-permittivity film (a high-permittivity film other than a silicon nitride film) and a silicon oxide film, or a single-layered high-permittivity film may be used as the inter-electrode insulating film 9. In this case, it is desirable that $HfO_2$ (hafnium oxide), $Ta_2O_5$ (tantalum oxide), $Al_2O_3$ (aluminum oxide), $La_2O_3$ (lanthanum oxide), $ZrO_2$ (zirconium oxide), $ZrAl_xO_y$ (aluminate) or $HfAl_xO_y$ (aluminate) be used as the high-permittivity film.

Since the cavity is formed between the upper surface of the floating gate electrode film and the inter-electrode insulating film as described above, the semiconductor device of the embodiment is capable of reducing the leakage current between the floating gate electrode film FG and the control gate electrode film CG.

Although the foregoing descriptions have been provided for the several embodiments of the present invention, the embodiments are presented as examples, and are not intended to limit the scope of the invention. These novel embodiments can be carried out as other various modes. Various omissions, substitutions and changes may be made to the embodiments within the scope not departing from the gist of the invention. Such embodiments and modifications are included in the scope and gist of the invention, and are included in the invention as recited in the scope of claims and the scope of equivalents.

What is claimed is:

1. A semiconductor device comprising:
    a semiconductor substrate;
    a plurality of memory cells being provided on the semiconductor substrate in a memory cell region; and
    a peripheral transistor disposed in a peripheral circuit region different from the memory cell region,
    wherein each of the plurality of memory cells has a first gate electrode disposed on the semiconductor substrate with a first gate insulating film, the first gate electrode having a first charge storage layer, a first inter-electrode insulating film, and a first control gate electrode film,
    wherein a first cavity is interposed between an upper surface of the first charge storage layer and the first inter-electrode insulating film,
    wherein the peripheral transistor has a second gate electrode disposed on the semiconductor substrate in the peripheral circuit region with a second gate insulating film, the second gate electrode having a second charge storage layer, a second inter-electrode insulating film, and a second control gate electrode film, and
    wherein a second cavity is interposed between an upper surface of the second charge storage layer and the second inter-electrode insulating film.

2. The semiconductor device of claim 1, wherein the first inter-electrode insulating film on the first charge storage layer has a pointed portion.

3. The semiconductor device of claim 2, wherein the upper surface of the first charge storage layer is flat.

4. The semiconductor device of claim 1, wherein an upper surface of the second gate electrode is lower than an upper surface of an element isolation insulating film placed in the peripheral circuit region.

5. The semiconductor device of claim 1, wherein an undersurface of the second inter-electrode insulating film is as high as an upper surface of an element isolation insulating film placed in the peripheral circuit region.

6. The semiconductor device of claim 1, wherein an upper surface of the second cavity is as high as an upper surface of an element isolation insulating film placed in the peripheral circuit region.

7. The semiconductor device of claim 1,
    wherein the upper surface of the second charge storage layer and an undersurface of the second inter-electrode insulating film are in direct contact with each other.

8. The semiconductor device of claim 1, wherein the first and the second inter-electrode insulating films include a high-permittivity film other than a silicon nitride film.

9. The semiconductor device of claim 1, further comprising a capacitor element disposed in the peripheral circuit region, the capacitor element including a third electrode, a third insulating film, and a fourth electrode disposed on the peripheral circuit region, the third electrode having a same material as a material of the first charge storage layer, the third insulating film having a same material as a material of the first inter-electrode insulating film, the third electrode having a same material as a material of the first control gate electrode film, an upper surface of the third electrode and an undersurface of the third insulating film being in direct contact with each other, and an upper surface of the third insulating film and an undersurface of the fourth electrode being in direct contact with each other.

10. A semiconductor device comprising:
    a semiconductor substrate;
    a plurality of memory cells being provided on the semiconductor substrate in a memory cell region; and
    a selection gate transistor disposed in the memory cell region,
    wherein each of the plurality of memory cells has a first gate electrode disposed on the semiconductor substrate with a first gate insulating film, the first gate electrode having a first charge storage layer, a first inter-electrode insulating film, and a first control gate electrode film,
    wherein a first cavity is interposed between an upper surface of the first charge storage layer and the first inter-electrode insulating film,
    wherein the selection gate transistor has a second gate electrode disposed on the semiconductor substrate in the memory cell region with a second gate insulating film, the second gate electrode having a second charge storage layer, a second inter-electrode insulating film, and a second control gate electrode film, and
    wherein a second cavity is interposed between an upper surface of the second charge storage layer and the second inter-electrode insulating film.

* * * * *